(12) United States Patent
Buller et al.

(10) Patent No.: US 7,244,953 B2
(45) Date of Patent: Jul. 17, 2007

(54) BEAM EXPOSURE WRITING STRATEGY SYSTEM AND METHOD

(75) Inventors: Benyamin Buller, Cupertino, CA (US); Richard L. Lozes, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/243,304

(22) Filed: Oct. 3, 2005

(65) Prior Publication Data

US 2007/0075275 A1 Apr. 5, 2007

(51) Int. Cl.
*H01J 37/302* (2006.01)
(52) U.S. Cl. ................................. 250/492.22
(58) Field of Classification Search ............ 250/492.22
See application file for complete search history.

(56) References Cited

U.S. PATENT DOCUMENTS

| | | | |
|---|---|---|---|
| 3,644,700 A | 2/1972 | Kruppa et al. | 219/121 EB |
| 3,900,737 A | 8/1975 | Collier et al. | 250/492 A |
| 4,145,597 A | 3/1979 | Yasuda | 219/121 EB |
| 4,243,866 A | 1/1981 | Pfeiffer et al. | 219/121 EK |
| 4,945,246 A | 7/1990 | Davis et al. | 250/492.2 |
| 5,876,902 A | 3/1999 | Veneklasen et al. | 430/296 |
| 6,214,496 B1 | 4/2001 | Carpio et al. | 430/5 |
| 6,262,429 B1 | 7/2001 | Rishton et al. | 250/492.23 |
| 6,274,290 B1 | 8/2001 | Veneklasen et al. | 430/296 |
| 6,433,348 B1 | 8/2002 | Abboud et al. | 250/492.22 |
| 6,774,380 B2 | 8/2004 | Abe | 250/492.23 |
| 6,803,582 B2 * | 10/2004 | Berglund | 250/396 R |
| 6,828,570 B2 | 12/2004 | Veneklasen, deceased et al. | 250/492.2 |

OTHER PUBLICATIONS

Boegli, V. et al., "Implementation of Real-Time Proximity Effect Correction In a Raster Shaped Beam Tool", 3705 EIPBN'00, VB mscript, Jun. 14, 2000, volker@etec.com.
Hartley, John G., et al., "Spatial-Phase Locking With Shaped-Beam Lithography", *Journal of Vacuum Science and Technology B* as part of the proceedings of the 45th *International Conference on Electron, Ion and Photon Beam Technology and Nanofabrication*, Washington D.C., May 29-Jun. 1, 2001 (Paper P2-2), hismith@nano.mit.edu.

* cited by examiner

*Primary Examiner*—Kiet T. Nguyen
(74) *Attorney, Agent, or Firm*—Shirley Church

(57) ABSTRACT

A beam exposure writing strategy method and system are disclosed for exposing a desired pattern on a substrate, by raster scanning a beam such as a particle beam, across a major field on the substrate. The beam is also vector scanned across a minor field of the substrate superimposed along the major field raster scan. The beam is selectively blanked and unblanked as the beam is being scanned. The unblanked flashes of the beam are modulated in coordination with the raster and vector scanning to expose the desired pattern on the substrate. The disclosed system and method generating an adjustable length microvector having a maximum range of at least about M times a nominal length $\lambda$, where M is equal to at least four and $\lambda$ is substantially equal to a dimension of a nominal flash area, the nominal flash location dimension being substantially greater than a field cell dimension.

30 Claims, 6 Drawing Sheets

BEAM EXPOSURE WRITING STRATEGY SYSTEM AND METHOD

RELATED APPLICATIONS

This application is related to U.S. patent application Ser. No. 11/243,299, filed Oct. 3, 2005 entitled "WRITING A CIRCUIT DESIGN PATTERN WITH SHAPED. PARTICLE BEAM FLASHES," incorporated herein by reference as if set forth herein in its entirety.

FIELD OF THE INVENTION

The present invention in general relates to a beam exposure writing strategy system and method. The invention more particularly relates to a system and method for facilitating the exposing of a pattern on a substrate by means of a beam, such as a particle beam or an optical beam, for an application such as for lithographic purposes.

BACKGROUND ART

There is no admission that the background art disclosed in this section legally constitutes prior art.

In certain types of beam writing systems, such as systems used for lithography, beams of energy are directed onto a coated substrate for interacting with it to form desired patterns. During a scan sequence of the beam, the pattern exposure is divided into discreet flashes, which are directed onto selected pattern areas of the substrate. The manner in which the dose, exposure sequence and shape of the flash are applied is referred to as a writing strategy.

There have been basically two types of writing strategies; namely, raster scan and vector scan systems. Prior known raster Gaussian beam writing strategies, for example, have been used in connection with particle beams such as electron beams, wherein the beam is scanned in raster manner over a field of view such as on a substrate. The beam is selectively blanked and unblanked as it is being scanned over the field. During the unblanking of the beam, a flash of the beam is directed onto the substrate and is modulated in coordination with the scanning in order to generate a pattern. The flash size is approximately the size of the address unit of the printing grid (set by the beam modulation). The flash has a substantially Gaussian profile in order that adjacent flashes blend smoothly together. The limited flash profile limits feature resolution and critical dimension (CD) uniformity.

A raster Gaussian beam has the advantage of an excellent pattern placement accuracy, and has a readily predictable writing speed. However, improving the resolution requires reducing the basic address unit. Such reduction results in the lengthening of the printing time quadratically.

The raster Gaussian beam method has been improved by permitting overlapping flashes and gray modulation for finer edge placement. However, the fundamental limitations (feature resolution and CD uniformity) have not been alleviated thereby.

A vector shaped beam strategy method is another writing strategy and includes a variable shape scanned in a vector fashion. The flash is modulated in coordination with the vectoring in order to generate a pattern. The flash size is independent of the addressing of the vector. The flash profile for a given flash size is much steeper than that of a correspondingly sized raster Gaussian beam flash. This improves feature resolution and critical dimension uniformity.

A vector shaped beam method may have the disadvantage for some applications of slow flash rate. The slow flash rate may be due to the use of high precision digital to analog converters (DAC) required for vectoring the beam.

A further writing strategy technique is a raster shaped beam method, which is a hybrid technique. In this regard, reference may be made to U.S. Pat. Nos. 5,876,902 and 6,262,429. It employs a raster scanned, shaped beam. As in the case of a vector shaped beam, a flash profile is steep, yielding good resolution and CD uniformity. As is the case for raster Gaussian beam, the scan is rastered, yielding excellent placement accuracy. Furthermore, the flash rate can be much higher than that employed in a vector shaped beam system, because only low resolution DACs are required.

A raster shaped beam system unfortunately may retain the disadvantage for some applications of the raster Gaussian beam system. In this regard, further improvements to the feature resolution may, for certain applications, quadratically lengthen printing time, or at least lengthen it significantly. This is as a result of each flash being confined substantially within a grid cell.

For example, in U.S. Pat. No. 5,876,902, a horizontal line shaped beam flash, having a maximum length of one flash origin field cell, can be exposed from a single raster scan origin only. Thus, the patented technique is designed to overlap flash exposures of the beam in the X coordinate. With such a technique, while being successful for certain applications, with patterns which have adjacent flash locations in the X direction, the patented method would require the adjacent flash location to be exposed during a subsequent scan line. Because of this operation, unwanted high frequency noise due to the deflection of the beam can be introduced for certain patterns.

BRIEF DESCRIPTION OF THE DRAWINGS

The features of this invention and the manner of attaining them will become apparent, and the invention itself will be best understood by reference to the following description of certain embodiments of the invention taken in conjunction with the accompanying drawings, wherein.

DETAILED DESCRIPTION OF CERTAIN EMBODIMENTS OF THE INVENTION

Figure 1:
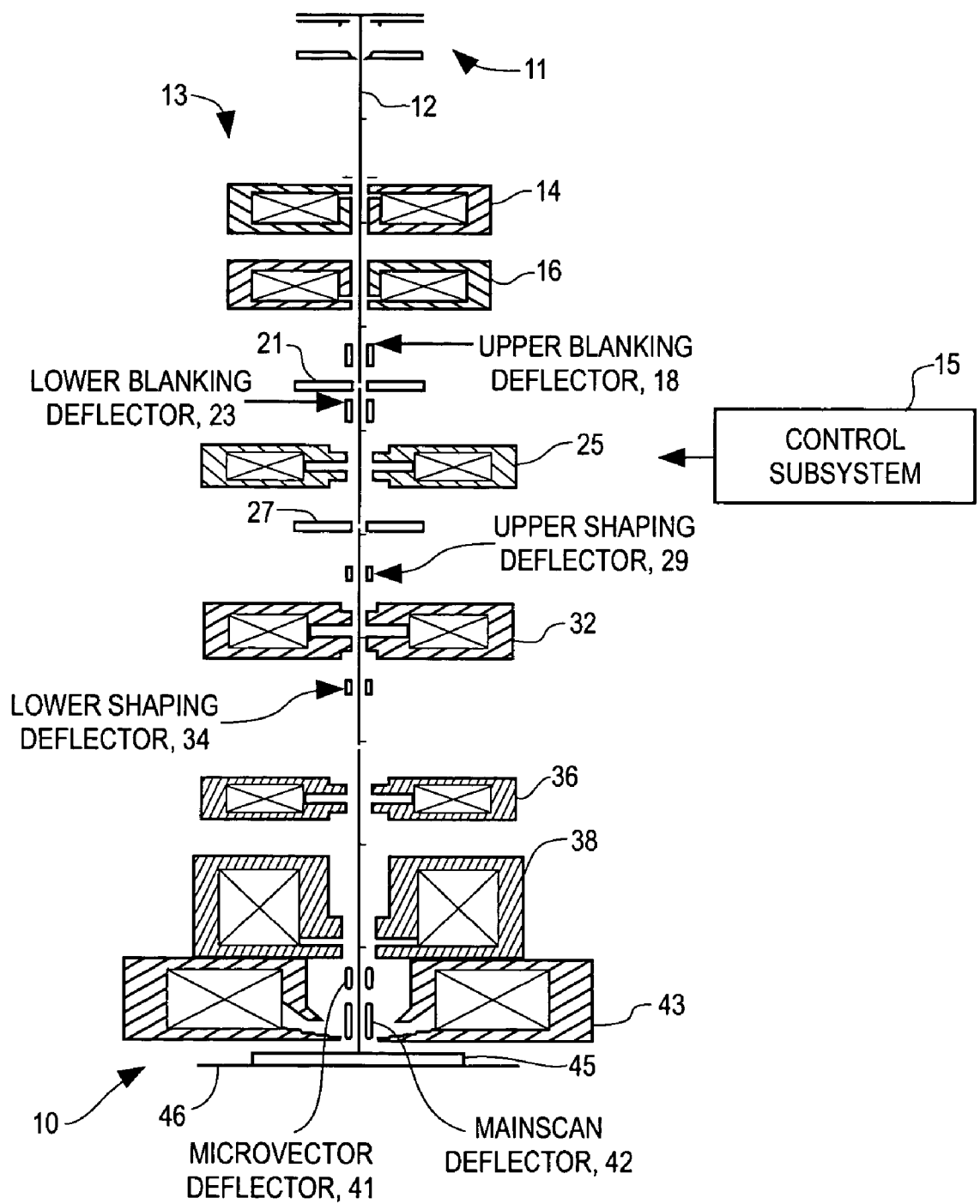
FIG. 1 is a functional block diagram of a beam exposure writing strategy system, which is constructed in accordance with an embodiment of the invention.

It will be readily understood that the components of the embodiments as generally described and illustrated in the drawings herein, could be arranged and designed in a wide variety of different configurations. Thus, the following more detailed description of the embodiments of the system, components and method of the present invention, as represented in the drawings, is not intended to limit the scope of the invention, as claimed, but is merely representative of the embodiment of the invention.

A beam exposure writing strategy method and system are disclosed for exposing a desired pattern on a substrate, by raster scanning a beam such as a particle beam, across a major field on the substrate. The beam is also vector scanned across a minor field of the substrate superimposed along the major field raster scan. The beam is selectively blanked and unblanked as the beam is being scanned. The unblanked flashes of the beam are modulated in coordination with the raster and vector scanning to expose the desired pattern on the substrate. The disclosed method and system generating an adjustable length microvector having a maximum range of at least about M times a nominal length λ, where M is equal to four and λ is substantially equal to a dimension of a nominal flash area, the nominal flash location dimension being substantially greater than a field cell dimension.

The flash locations may overlap in the Y coordinate direction but not in the X coordinate direction. The number of pattern features written with flashes from adjacent scans is minimized or greatly reduced, since X coordinate overlap is not permitted. As a result, low frequency deflection noise is eliminated or greatly decreased, since exposure of pattern features from adjacent scans is eliminated, and thus low frequency noise is greatly reduced or eliminated. There is no need to wait until an adjacent scan occurs, since such an operation could cause the unwanted low frequency deflection noise.

In accordance with certain embodiments of the invention, the vector scanning includes locating selectively adjustable pattern areas. In this regard, the vector scanning includes utilizing adjustable length microvectors having a range of between about 4λ and about 16λ. The vertical pitch of the major field, as provided for by an embodiment of the invention, may be substantially equal to 1/N times λ, where N is equal to at least about 2.

The vector scanning according to certain embodiments of the invention includes generating the microvectors at flash opportunity raster locations spaced along Y coordinate scan lines of the major field of the raster scan. Each one of the microvectors reach a given one of selectively adjustable pattern areas.

The disclosed embodiment of the invention relates to the raster scan progressing along X and Y grid coordinates, and beam flashes are caused to occur based on certain selected raster locations. The flashes occur as the major scan advances along a Y coordinate direction major scan line. According to an embodiment of the invention, each microvector extends between a raster location and a corner portion of a pattern area.

According to another embodiment of the invention, there is provided a raster microvector shaped beam writing strategy method, which alleviates the printing speed limitations of prior known writing strategies with improved writing accuracy in certain applications. In the raster microvector shaped beam method according to an embodiment of the invention, a variable shaped flash may be scanned by the two superimposed techniques. Flash modulation is coordinated with the raster major field scanning and the vector minor field scanning to generate the desired pattern.

The disclosed embodiment of a raster microvector beam strategy method has the advantage of predictability, and is fast acting for certain applications. Such a writing strategy method according to certain embodiments of the invention create a high-resolution printing technique independent of pattern complexity. The pattern placement error in such a raster microvector technique, according to the disclosed embodiments of the invention, is small for certain applications, and is comparable to that of raster Gaussian beam techniques. Feature resolution and CD uniformity are small, comparable to those of vector shaped beam strategies.

The raster microvector writing strategy method and system of the disclosed embodiments of the invention provide a variable shaped flash scanned by two separate superimposed means, a raster major field scan, and a vector minor field scan, where each vector field may be assigned at most one flash. Vector fields overlap along the raster scan in the Y coordinate only, to locally average pattern density fluctuations in accordance with the disclosed embodiments of the invention.

The raster microvector strategy technique of the disclosed embodiments of the invention permit critical dimensions to be printed rapidly, and avoid or at least greatly reduce substantial influences of noise. Also, critical dimensions may be defined by one aperture, and avoid to any great extent the influence of drift on the beam.

Referring now to the drawings, and more particularly to FIG. 1 thereof, there is shown a beam exposure writing strategy system 10, which is constructed in accordance with an embodiment of the invention. The system 10 includes an electron gun assembly 11 for producing an electron beam 12 for a column generally indicated at 13. In a preferred embodiment of the present invention, a thermal field emission (TFE) beam source is provided. It should be understood that while an electron beam system is disclosed, other types and kinds of energy beams such as other particle beams and optical beams, may employ the principles of the invention.

The column 13 is controlled by a control subsystem 15. The column 13 includes a pair of condenser lenses 14 and 16 mounted above upper blanking deflector plates 18. A first aperture 21 is disposed between the upper blanking deflector plates 18 and a pair of lower blanking deflector plates 23.

Upper shaping lens 25 is disposed below the lower blanking deflector plates 23 and above a second aperture 27. An upper shaping deflector 29 is disposed between the second aperture 27 and transfer lenses 32. Lower shaping deflector plates 34 are disposed below the transfer lens 32 and above a lower shaping lens 36, which is disposed immediately above a deflector lens 38.

Microvector deflector plates 41 are disposed below the deflector lens 38 for microvector control. The plates 41 are disposed above a main scan deflector plates 42 for the main raster scan control. An object lens 43 directs the flash onto a substrate 45 supported on a moveable X-Y stage 46.

In the raster microvector scan writing strategy method as disclosed herein, the maximum useful flash size may be set by the complexity of the pattern or patterns to be printed. For integrated circuit mask patterns on the 65 nm, and 45 nm generations, for example, this size is approximately 128 nm. In any event, due to interelectron interaction induced blur, the electron beam column 13 of FIG. 1 may not deliver any larger shape at the required current density without at least somewhat degrading the flash edge blur on the substrate 45.

A minimum useful microvector length may be set by the density of the pattern or patterns to be printed. The area reachable by the microvector from a given flash opportunity raster location on the raster scan line may average over written and unwritten pattern areas. For integrated circuit mass patterns of the 65 nm and 45 nm generations, the needed microvector length may be approximately 1,000 nm.

Figure 2:
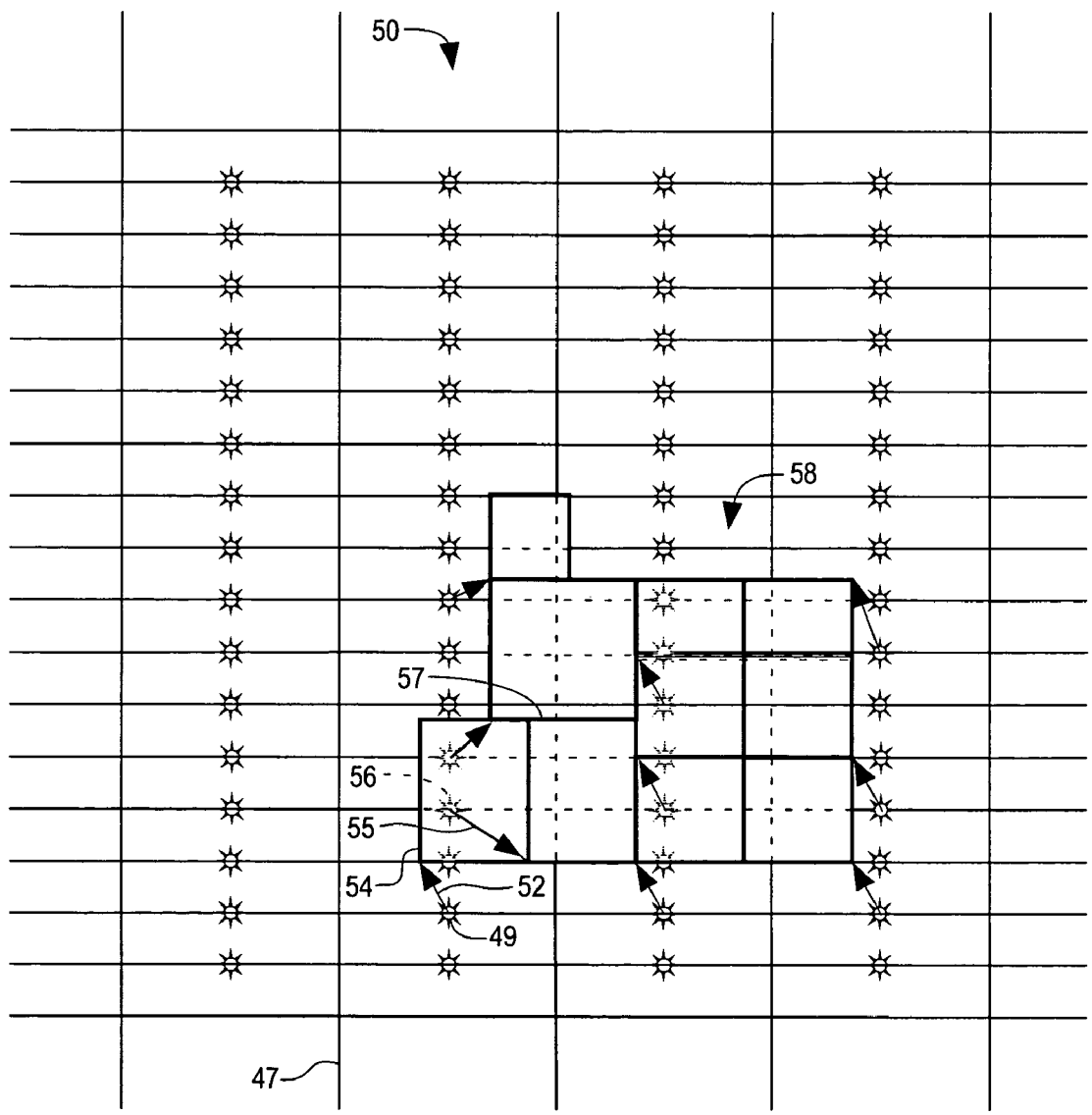
FIG. 2 is a diagram illustrating the beam exposure writing strategy method utilized by the system of FIG. 1.

As shown in FIG. 2, the beam 12 (FIG. 1) of the system 10 is raster scanned across a major scan grid field 47 for the substrate 45 (FIG. 1). The vector scanning includes the generation of microvectors such as a microvector 52 at flash opportunity raster locations such as a raster location 49, spaced along a Y coordinate scan line generally indicated at 50 of the major grid field 47. Each one of the microvectors reach a given one of selectively adjustable size and shape flash areas, such as a flash location 54 to form a portion of a desired pattern area 58 to be exposed. Such a flash location is selectively adjustable in both size and shape.

The major raster scan progresses along the X and Y axes of the raster grid field 47. The beam flashes are caused to occur at selected raster locations. In this regard, the flashes occur as the beam 12 advances upwardly along a Y axis scan line only.

Each microvector may extend adjustably between one of the raster locations such as the raster location 49, and a flash origin at a corner, such as a lower left corner of a flash location such as the flash area 54. It should be understood that the flash origin can be disposed at other positions at the flash location such as any one of the four corners or other. The length of the microvectors is adjustable. For example, the microvector 52 is shorter than a microvector 55 emanating from a flash opportunity raster location 56 and extending to a corner of a flash area 57.

As the major raster scan advances upwardly along a Y axis coordinate of the field grid 47, a flash area such as a flash area 54 is designated by a vector such as the vector 52 which is generated at a raster location such as the raster location 49, which is on the scan line 50, and which may be the closest to the flash area 54 within the microvector range.

Figure 3:
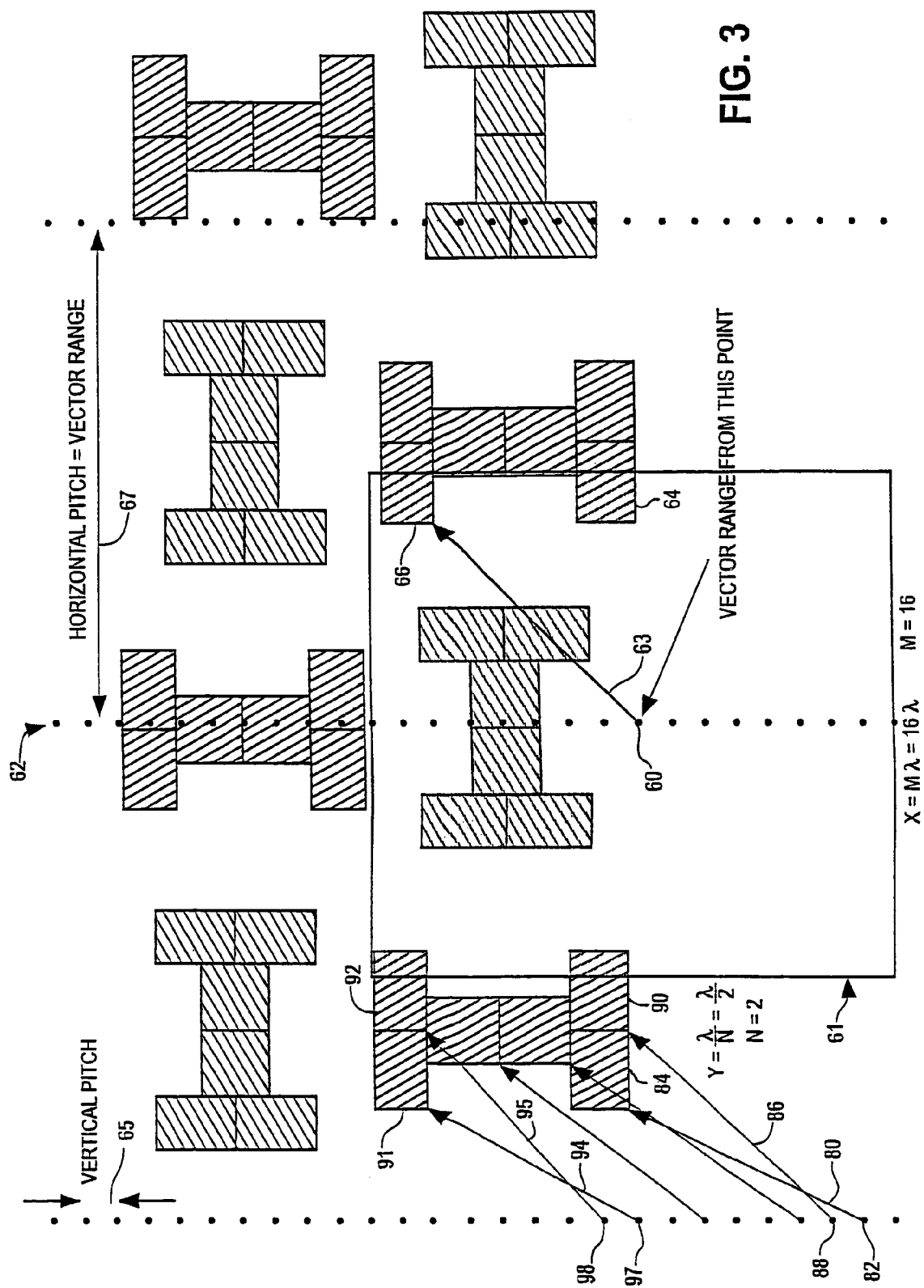
FIG. 3 is a diagrammatic view, similar to the view of FIG. 2, illustrating a writing example of the system of FIG. 1.

As best seen in FIG. 3, the microvectors occur at a flash opportunity which may be the closest to a given flash area. As a result, various flashes occur to provide the desired writing pattern according to the writing strategy method of the disclosed embodiment of the invention. As indicated in FIG. 3, there is an area 61 for a vector range for a given microvector for designating given flash areas. For a given raster location 60 along a scan line 62, there is a vector range to reach certain flash areas such as flash areas 64 and 66. Thus, from the raster location 60, a microvector 63 can reach certain ones of the flash areas, such as the flash area 66, within the vector range as indicated. As indicated in FIG. 3, there is a vertical pitch 65 as well as a horizontal pitch 67. The horizontal pitch 67 is equal to the vector range in the preferred form of the invention.

As shown in FIG. 2, the raster grid field such as the field 47 has a number of equally spaced apart flash opportunity raster locations, such as the raster location 49 extending along a Y scan line. The Y coordinate direction spacing is less than the X direction spacing, and the flash opportunities occur only along the Y axis from bottom to top.

Figure 4:
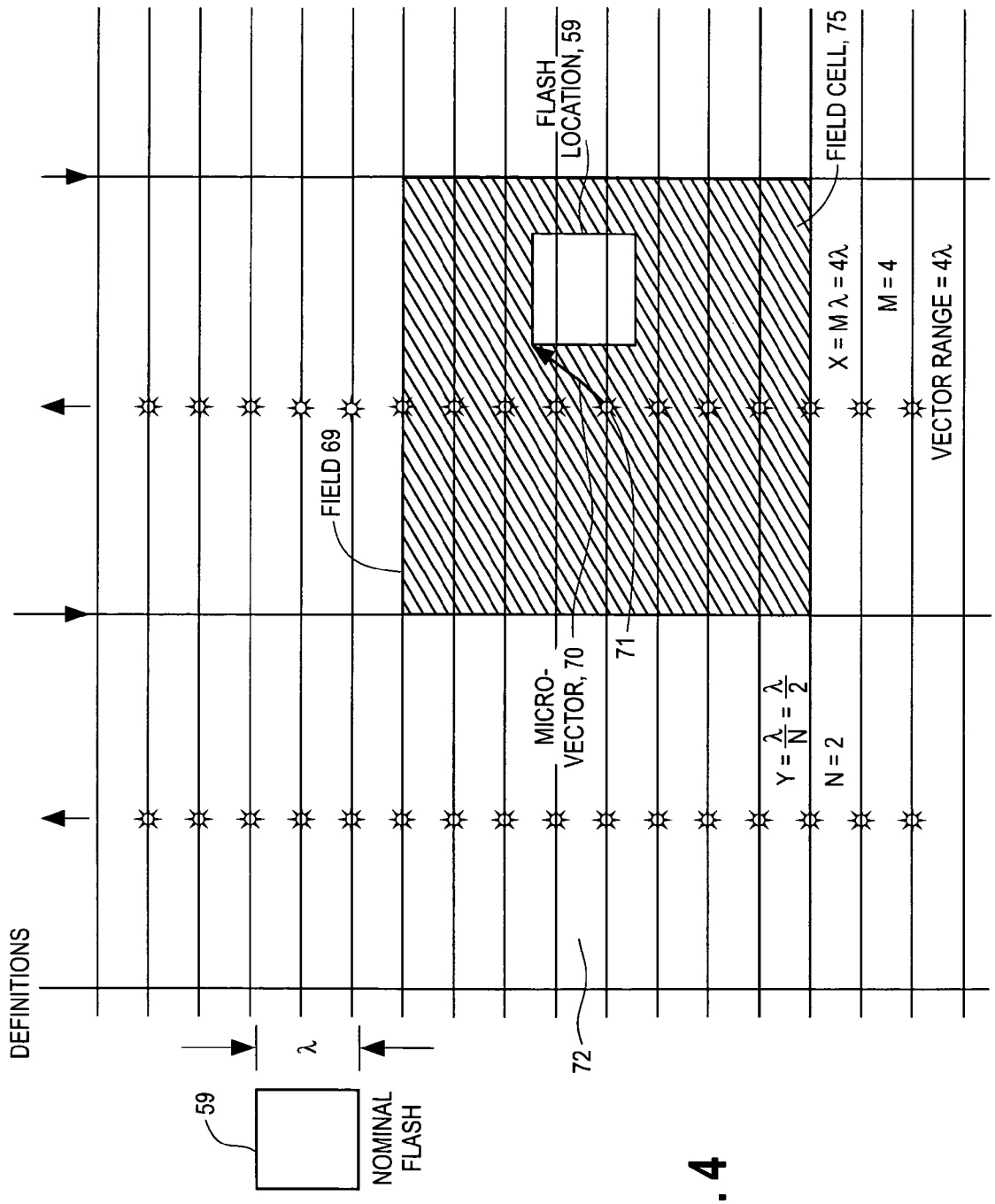
FIG. 4 is a view similar to FIG. 2, illustrating various definitions.

Referring now to FIG. 4, $\lambda$ may, for example, be 128 nm. A nominal maximum flash area 59 may be $1.0\lambda^2$ in area. The nominal maximum may be used for all flashes except those which are strictly interior to an exposed figure. In this case, a larger flash, such, for example, as about $(1.5\lambda)^2$ permits reducing the flash count without impacting the edges of printed features, which edges determine CD uniformity. The writing strategy according to the disclosed embodiments of the invention is designed to map less than or equal to one flash per grid field in a locally averaged sense.

The grid fields overlap in the Y coordinate direction but not in the X coordinate direction. The beam raster scan moves upwardly quickly (nanoseconds) between nearby flash origins in the Y direction as the XY stage 46 moves from right to left. Because there may be many thousands of such locations in a raster scan line, it takes 10s to 100s of microseconds to move between adjacent scan lines. Due to this time difference, the two axes are asymmetrically affected by random noise, but the X axis is far the more sensitive. It is therefore beneficial to minimize or at least greatly reduce the number of pattern features written with flashes from adjacent scans and maximize or at least greatly increase the number of pattern features written with flashes from the same scan. This may be accomplished by disallowing grid field overlap in the X axis. After the beam completes its upward movement along a scan line, the beam quickly returns downwardly along the Y direction.

By increasing or maximizing the coverage of the desired pattern with the flashes from a single scan, the need to overlap flashes in the X direction is eliminated and thus low frequency deflection noise if greatly reduced. There is no need to complete the exposure of a pattern during a subsequent scan line, thereby introducing unwanted and undesirable low frequency deflection noise. Additionally, the exposure of the pattern can be quickly achieved since the raster locations are closely spaced in the Y direction to enable a series of rapid fire flashes to occur. In embodiments of the invention, the raster locations may be spaced in time between about 2.5 nsec and about 5.0 nsec. However, it is to be understood that other spacings in time may also be employed.

As in the case for all raster scan writing strategies, the main raster ramp may be a periodic signal. Periodic signals may be precisely tuned to be linear and absolutely reproducible for many applications. All DACs (not shown) for implementing the raster microvector strategy method of the disclosed embodiments of the invention may be low resolution, and therefore may be very high speed. This may permit flash rates on the order of between about 200 and about 400 MHz and possibly higher for some applications.

Referring now to FIG. 3, there is shown various writing examples, which illustrate the ability to greatly reduce the number of pattern features written with flashes from adjacent scans, and to maximize or at least greatly increase the number of pattern features written with flashes from the same scan line. For example, a microvector 80 extends between a flash opportunity raster location 82 and a flash location 84. A microvector 86 extends between the next raster location 88 and a flash location 90 disposed adjacent in the X direction to the flash location 84. Thus, both flash locations 84 and 90, located adjacent to one another in the X direction, can be exposed during two adjacent raster locations, and thus can occur at a rapid fire pace, without the need for waiting to expose the flash location 90 during the subsequent scan line 62. Such a wait can introduce unwanted high frequency deflection noise.

As a further example, a set of two flash locations 91 and 92 are disposed adjacent to one another in the X direction, and can be reached by two respective microvectors 94 and 95 emanating respectively from their raster locations 97 and 98. These two raster locations are adjacent to one another, and thus the flashes can occur at a high rate of speed, without the need for introducing low frequency deflection noise by waiting to expose the flash location 92 during the subsequent scan line 62. Thus, it can be seen that, in accordance with the embodiment of the present invention, adjacent flash locations ranged in the X coordinate can be reached from a series of different raster locations during a single Y direction scan.

Figure 5:
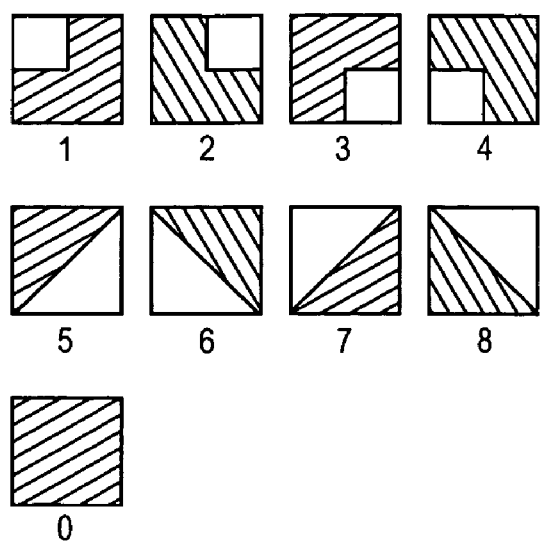
FIG. 5 depicts 10 basic shapes in accordance with the embodiment of the present invention as produced by the system of FIG. 1.

As best seen in FIG. 5, the flash repertoire includes rectangles and right isosceles triangles only.

As shown in FIG. 4, the nominal maximum for a flash area 59 within a field 69 as designated by a microvector 70 emanating from a raster location 71, may be 1.0λ by 1.0λ. A microvector range may extend into neighboring fields such as neighboring field 72, and thus resolve connected, convex vertices. A map is initialized so that less than or equal to one flash per grid field on average may be established. The grid fields may overlap in the Y direction, and the grid fields do not overlap in the X direction. The flash repertoire is created by the beam 12 being shaped and produces convex shapes. The result is low noise. In the Y axis, forming CD in characteristic time may be less than the high frequency noise. In the X direction, low frequency noise may be reduced to about zero for certain applications. Beam blur approaches about zero, and a given implementation may reach approximately 12 nm.

The pattern formation of the system 10 of FIG. 1 provides the printing of arbitrary patterns. There is a limited shape (flash) repertoire. In the raster scan, there may be one flash per raster location. This is a strong constraint. In the embodiment of the present invention, the writing strategy provides for four-pass printing. In the operation of the system 10, there may be about an eight hour printing time for typical density patterns. This will determine the clock speed. The fracture unit λ is a defined unit. The microvector range may be determined at a multiple of λ, such for example, as 8λ. This may permit averaging density of over one pattern pitch. The maximum flash may be set at 1.5λ. This is approximately two times the normal flash area. This is at the interior only, and is limited by blur degradation and by optics current range. The minimum flash is zero, and thus it is desired to maintain above about three times the blur, or 0.5λ, whichever is larger for certain applications.

The quantity λ is set such that the densest pattern flashing maps 1:1 onto the grid. The grid X is equal to λ×M, and the grid Y is equal to λ÷N. It may be determined empirically by starting with M being equal to N. Nominally, it is preferred that M and N may equal 8. If all of the flashes cannot be assigned, then N is increased for the stripe. This may be implemented by physically shortening the scan, not by changing the scan timing. This implies a constant number of raster points per scan. A small set of values for N are predefined. The scan height is precalibrated, linear correction and other.

As shown in FIG. 4, a field cell 75 within the field 69 has a Y dimension equal to λ/N, which is the example of FIG. 4 is equal to λ/2. In this regard, the vertical pitch is equal to λ/2, and thus the height of one cell is λ/2. The field cell 75 has an X dimension equal to Mλ, which in the example is equal to 4λ. Thus, the vector range is 4λ.

As shown in FIG. 3, Y=λ/N=λ/4. Also, X=Mλ=4λ.

In general, there can be a variety of values selected for N and M, depending on a variety of operating points.

As shown in the following table, there are a number of operating points which may be selected empirically for a variety of conditions:

| | Flash rate (MHz) | Flash size (nm) | Flash/scan | X multiplier | Y divisor | Retrace time (μs) | Stage speed (mm/s) | Exposure time (hr) | Scan height (μm) |
|---|---|---|---|---|---|---|---|---|---|
| 200 MHz baseline | 200 | 128 | 8192 | 8 | 8 | 4 | 22.8 | 7.98 | 131.07 |
| 200 MHz sparse | 200 | 128 | 8192 | 8 | 4 | 4 | 22.8 | 3.99 | 262.14 |
| 400 MHz baseline | 400 | 96 | 8192 | 8 | 8 | 2 | 34.2 | 7.83 | 98.30 |
| 400 MHz sparse | 400 | 96 | 8192 | 8 | 4 | 2 | 34.2 | 3.92 | 196.61 |
| 400 MHz alternate | 400 | 96 | 16384 | 8 | 8 | 4 | 17.1 | 6.74 | 196.61 |

It may be seen from the foregoing table that the exposure times are less than or equal to about 8 hours. Other factors include the raster scan retrace time and the XY stage speed. Note also that the pattern to be written, given the various factors, can be provided with certain values of M and N. It has been determined that having both M and N equal to 8 provides a nominal desired arrangement.

Considering now the thermal field emission particle source assembly 11, the assembly 11 includes illuminated, imaged, shaped beam particle optics. Conventional imaged, shaped beam particle optics have been illuminated by thermionic sources, notably lanthanum hexaboride ($LaB_6$) in the case of electron sources. The lanthanum hexaboride source is well suited to the present application because it produces a large, uniform particle distribution with adequate brightness. This source has been employed to illuminate an imaged, shaped beam in critical illumination mode and in Köhler illumination mode.

A thermal field emission source may be poorly matched to the task of illuminating a shaped beam optics. The TFE source is very small (20-30 nm). If used in critical illumination mode, this source may have to be magnified to be significantly larger than the shape aperture(s). The conventional electrostatically focused particle gun utilizing a TFE source has a large spherical aberration coefficient. Upon magnification, spherical aberration grows as the product of the coefficient times the third power of the illumination angle times the magnification. If used in Köhler illumination mode, it also may happen that the TFE source may require strong magnification. Thus, both critical and Köhler illumination of a manufacturable aperture (which forms the shape of the shaped-beam optics and is typically larger than 1 μm), may lead to excessively large spherical aberration due to the magnification required for certain applications.

Nonetheless, it is desirable to use TFE illumination for the reasons delineated in U.S. Pat. No. 5,876,902 and U.S. Pat. No. 6,262,429. The present embodiment of the invention uses TFE illumination in Köhler mode of an imaged, shaped beam particle optics, with provision to solve the problem of excessive spherical aberration for certain applications. This is not obvious, since one expects the beam to blur due to Coulomb repulsion within the beam as one decreases the illumination and acceptance angles in order to control spherical aberration. However, it has been determined that this expectation may not be fulfilled in actual use.

Non-imaged, shaped beam particle optics have been illuminated by thermal field emission sources, notably zirconiated tungsten in the case of electron sources. Rishton utilized shadow projection shaped-beam optics in order to avoid magnifying this small source. Shadow projection optics have undesirable properties including most importantly lack of focus of the beam spot onto the image plane.

The following is a list of definitions:
α Semi-angle of illumination ray cone
β Semi-angle of image-forming ray cone
M Magnification from source to image (at or below aperture plane)
$C_s$ Spherical aberration coefficient (referred to object)
D Demagnification of image-forming optics from lower shape to writing plane In optics, the Köhler condition is met when the illumination rays converge to form an image of the source in the back focal plane of the objective lens. See FIG. 1. This condition results in invariance of the shaped beam size vs. focus near the image plane.

In Köhler optics, the semi-angles α and β are directly proportional. The spherical aberration of the illumination at the aperture plane is given by $$C_s \alpha^3 M$$

The proportionality is enforced because it is desired that the shape aperture lie in a plane conjugate to the source. This positions a magnified image of the source below the aperture. Furthermore, the size of this source image sets the acceptance angle β at the final image plane of the following optics.

For a conventional optics, the following values are typical:

| | |
|---|---|
| α | 1 mrad |
| β | 4 mrad |
| M | 1/3 |
| D | 20 |
| Aperture size | 80 μm |
| Spherical aberration | 3.5 nm |

Severe illumination non-uniformity at the shape plane may result from this large value of spherical aberration, were a TFE particle source merely substituted for the conventional $LaB_6$ source.

Figure 6:
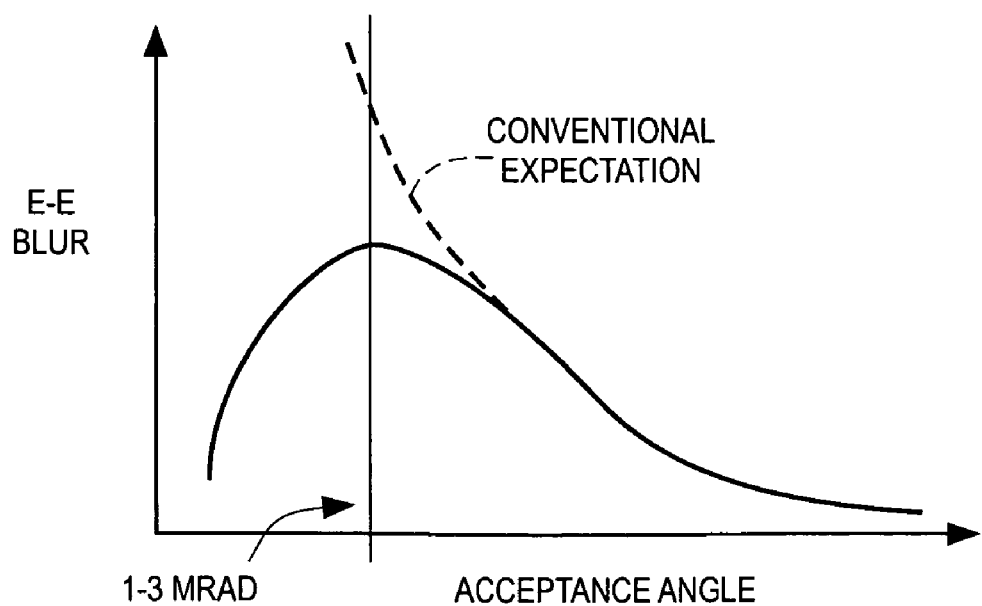
FIG. 6 is a graph, which is helpful to understand an embodiment of the invention.

Referring to FIG. 6 at least three design approaches are possible to eliminate or greatly alleviate the problem of spherical aberration:

1. Reduce the acceptance angle relative to conventional designs (which run around 3-5 mrad).
2. Illuminate using a TFE particle source with significantly reduced spherical aberration coefficient.
3. Illuminate using a TFE particle source with significantly increased virtual source size.

Combination of these design approaches may also be possible. As shown in FIG. 6, conventional understanding predicts that interelectron repulsion-induced blur increases as the final acceptance angle decreases. It has been determined that a column, shorter in length and featuring a wider beam half-angle may be effective in reducing the Coulomb interaction at high beam currents. The conventional optics operates in the Gaussian beam regime in order to transfer sufficient current from the thermionic source into the desired beam.

Reducing the acceptance angle sufficiently moves the system into the pencil beam regime. A thermal field emission source has sufficient brightness (~1000 times as bright as a lanthanum hexaboride source) that one can transfer sufficient current into the desired beam even at small acceptance angle. In the pencil beam regime, by contrast to the Gaussian beam regime, the interelectron repulsion-induced blur decreases with decreasing final acceptance angle. Since most optical aberrations are functions of acceptance angle to positive powers as well, significant improvement of beam definition by reducing the angle may be achieved. Depth of focus also rapidly increases with reduced angle.

Since the spherical aberration is given by a coefficient times the acceptance angle to the third power times the magnification, we see that the above technique relies on reducing the acceptance angle. A second technique relies on reducing the coefficient. The spherical aberration coefficient of a lens depends on the details of the lens design. In particular, U.S. Pat. No. 4,554,845 teaches that a magnetic gun lens is greatly superior to the conventional electrostatic gun lens as regards spherical aberration.

A third technique for reducing the spherical aberration relies on reducing the magnification of the source. This can only be done if the original source is larger than conventionally found in TFE guns. The source of a thermal field emission gun can be enlarged by enlarging the tip from which the particles emit. However, gun brightness rapidly decreases with increasing tip size.

Figure 7:
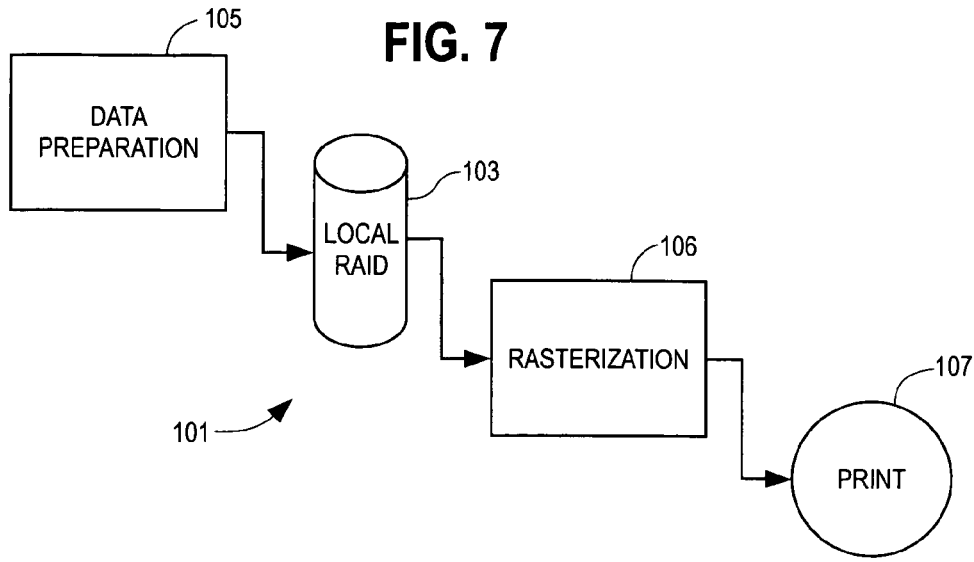
FIG. 7 is a schematic block diagram of the control arrangement for the system of FIG. 1.

Considering now the rasterization implementation with reference to FIG. 7, there is shown a rasterizer subsystem generally indicated at 101. In use, data is prepared offline and stored on a local memory device 103 such as a RAID memory device. Data is read from the memory device 103 to drive a rasterizer 106 in real time, synchronized with printing or writing onto the substrates as indicated diagrammatically at 107.

Data preparation 105 includes operations such as pattern merging, figure overlap removal, pattern sizing, scaling and orientation. For the RMV writing strategy of the embodiment of the invention, data preparation importantly includes the operations of fracturing arbitrary polygons into restricted polygons (for example, rectangles, right triangles and trapezoids), and creating a coarse scaled pattern density map for proximity correction. The restricted polygons (hereinafter, figures) and coarse density map are stored on the memory device. The major operations of the rasterizer 106 are displayed in FIG. 8.

Figure 8:
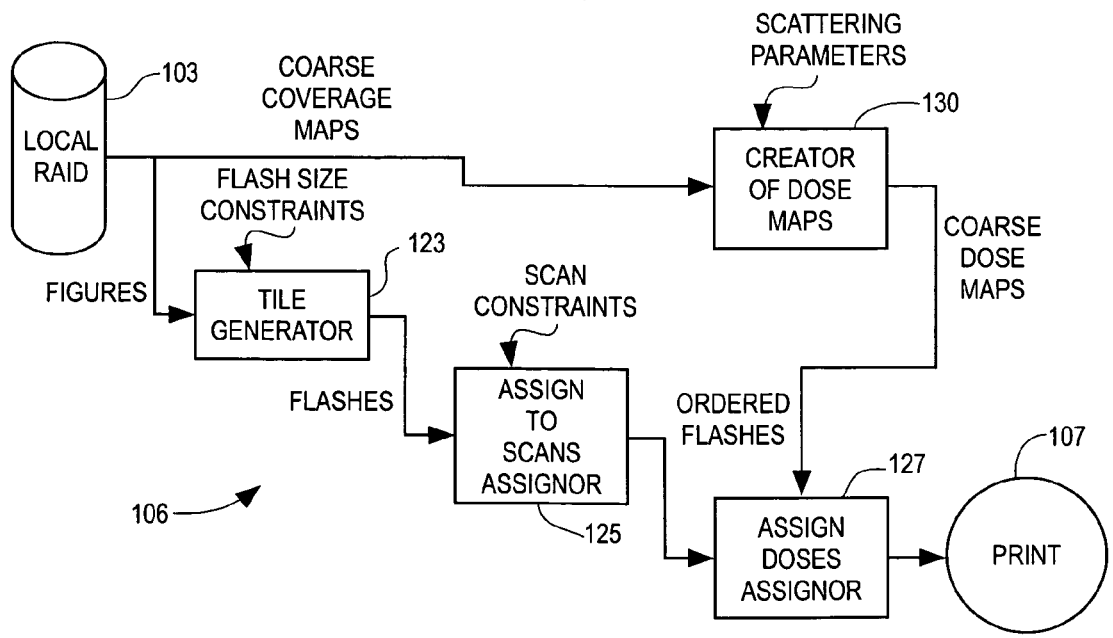
FIG. 8 is a flow chart diagram illustrating the data flow for the system of FIG. 1.

As shown in FIG. 8, figures flow from the memory device 103 to the operation "Tile" by means of the tile generator 123, where they are tiled by flashes which the pattern generator hardware (not shown) can expose. These flashes are restricted by "flash size constraints" at the assignor 125.

Flashes are then assigned to raster scans by the assignor 125. This assignment is restricted by scan constraints such as scan length (expressed in units of length such as microns), number of raster locations per scan, and scan width. The following operations are followed in "Assign to scans" by the assignor 125:

1. Associate each flash with one scan, according to the flash location in the pattern and the flash origin.
2. For each scan, sort all flashes into (ascending) order, and assign each flash to one raster location.

In the tiling algorithm, the embodiment of the writing strategy differentiates between flashes which define the edges of printed features and those which fill the interior. Since interelectron interaction induces beam blurring which increases with increasing beam current, the area of flashes which define edges must be limited to the greatest extent possible, while the blur of those flashes on the interior has no impact on printing fidelity. This differentiation reduces flash count and thereby improves printing speed while maintaining good printing fidelity.

In the flash assignment algorithm, methods optimally assign flashed to raster scans. More than one flash may touch a given raster location. The rasterizer 106 described herein implements data flow to enable the writing strategy of the embodiment of the invention disclosed herein.

An assignor 127 receives ordered flashes from the assignor 125 and receives coarse dose maps from dose maps creator 130. The creator 130 receives course coverage maps from the local memory 103 as well as scattering parameters.

Considering now the writing strategy algorithm in greater detail, the writing strategy algorithm sorts the flashes along a major scan line. A collection of flashes, all belonging to one scan line, is sorted into structure from which final assignment of flashes to microvector origins is to be made. This may require a sort on the Y coordinate. Creating the data structure is linear in the number of flashes.

There may be no need to test and branch anywhere in the loop over flashes. The algorithm is linear in the number of flashes.

The final assignment of flashes to origins starts at the bottom of the structure. If count >8, then stop. If count >0, pop last element. Then, decrement the count. Then, assign the lowest possible origin. A loop can then be undertaken.

This is in the inverse of filling the structure.

A similar algorithm may be used for the bucket sort of flashes to scan lines. It is also not necessary to test and branch in this case.

The algorithm to assign flashes to micro-vector origins has the objective of assigning flashes to micro-vector origins within a single scan line.

The following is a listing of a data structure and algorithm for an embodiment of the invention:

```
1-dimensional array of counters (0:8191), sublist lengths
1-dimensional array of pointers (0:8191) to sublists
1-dimensional array of pointers (0:8191), final flash assignment
Set of flashes to be assigned
Algorithm
Initialization
/* Test cardinality of set of flashes to be assigned
if cardinality > 8192
then STOP /* No assignment possible
Initialize counters to 0
Initialize sublist pointers to null
Initialize final flash pointers to null
Data Structure filling
do while set of flashes not empty      /* Loop over flashes
    Let I = ceiling ((flash origin relative to cell 0)/(cell spacing))      /*Y direction
        Increment counter(i) by 1
        Add flash to head of list, pointed to by pointer (i)
end while
Data structure emptying
do j = 0,8191
    if count(j)>8
        then STOP           /*Assignment not possible
    while count(j)>0
        Pop flash at head of list at pointer(j)
        Compute range of micro-vector origins that can reach this flash
        Assign the lowest unoccupied (null pointer), reachable
micro-vector origin
        Decrement count(j)
end do
```

Advantage

This algorithm requires time (operations) linear in the number of flashes to be assigned, plus a constant, as follows:
 1) the initialization involves no branching;
 2) the data structure filling accomplishes a sorting of the flashes without any comparisons in the loop; and
 3) the data structure emptying is deterministic, with expected time linear in the number of flashes.

The absence of branches in the first two phases helps to insure optimal, or at least a highly desirable, execution time. This is important since this is part of a time-critical function.

Remarks

This algorithm is a variant of the bucket sort. The variation is wholly contained in determining to which cell one assigns each flash. In that respect, it is similar to a hash table construction, searching for the "lowest unoccupied origin" among a finite range of possibilities.

While particular embodiments of the present invention have been disclosed, it is to be understood that various different modifications are possible and are contemplated within the true spirit and scope of the appended claims. There is no intention, therefore, of limitations to the exact abstract or disclosure herein presented.

What is claimed is:

1. A beam exposure writing strategy method of exposing a desired pattern on a substrate, comprising:
    forming a beam;
    raster scanning the beam across a major field on the substrate;
    vector scanning the beam across a minor field of the substrate superimposed along the major field raster scan;
    selectively blanking and unblanking the beam as it is being scanned;
    modulating unblanked flashes of the beam in coordination with the raster and vector scanning to expose the desired pattern on the substrate; and
    generating an adjustable length microvector having a maximum range of at least about M times a nominal length $\lambda$, where $\lambda$ is substantially equal to a dimension of a nominal flash area, the nominal flash area dimension being substantially greater than a field cell dimension.

2. A beam exposure writing strategy method according to claim 1, wherein the adjustable length microvector has a range of between about $2\lambda$ and about $16\lambda$.

3. A beam exposure writing strategy method according to claim 2, wherein a vertical pitch of the field cell is substantially equal to $1/N$ times $\lambda$ where N is equal to at least about 2.

4. A beam exposure writing strategy method according to claim 3, wherein N is between about 2 and about 16.

5. A beam exposure writing strategy method according to either one of claims 3 or 4 wherein N is substantially equal to 8 and M is substantially equal to 8.

6. A beam exposure writing strategy method according to claim 3, wherein the microvector range is equal to about a horizontal pitch of the major field.

7. A beam exposure writing strategy method according to either one of claims 1 or 2, wherein each microvector has a maximum useful length of about 2,000 nm.

8. A beam exposure writing strategy method according to claim 1, wherein flash locations overlap in the Y coordinate direction only.

9. A beam exposure writing strategy method according to claim 1, wherein the vector scanning includes generating microvectors at flash opportunity raster locations spaced along the major field scan lines.

10. A beam exposure writing strategy method according to claim 9, wherein each one of the microvectors reaches a given one of selectively adjustable pattern areas.

11. A beam exposure writing strategy method according to claim 10, wherein the selectively adjustable pattern areas include rectangles.

12. A beam exposure writing strategy method according to claim 10 wherein the selectively adjustable pattern areas include right isosceles triangles.

13. A beam exposure writing strategy method according to any one of claims 9-12, wherein the raster scan progresses along X and Y grid coordinates, further including causing beam flashes to occur at selected raster locations.

14. A beam exposure writing strategy method according to claim 13, wherein the flashes occur as the major scan advances along Y coordinate scan lines only.

15. A beam exposure writing strategy method according to claim 10, wherein the microvector extends between a raster location and a corner position of a flash area.

16. A beam exposure writing strategy system for exposing a desired pattern on a substrate, comprising:
   means for forming a beam;
   means for raster scanning the beam across a major field on the substrate;
   means for vector scanning the beam across a minor field of the substrate superimposed along the major field raster scan;
   means for selectively blanking and unblanking the beam as it is being scanned;
   means for modulating unblanked flashes of the beam in coordination with the raster and vector scanning to expose the desired pattern on the substrate; and
   means for generating an adjustable length microvector having a maximum range of at least about M times a nominal length $\lambda$, where M is equal to at least two and $\lambda$ is substantially equal to a dimension of a nominal flash area, the nominal flash area dimension being substantially greater than a field cell dimension.

17. A beam exposure writing strategy system according to claim 16, wherein the vector scanning includes locating adjustable pattern areas.

18. A beam exposure writing strategy system according to claim 17, wherein a vertical pitch of the field cell is substantially equal to 1/N times $\lambda$ where N is equal to at about 2.

19. A beam exposure writing strategy system according to claim 18, wherein N is between about 2 and about 16.

20. A beam exposure writing strategy system according to claim 19, wherein N is substantially equal to 8 and M is substantially equal to about 8.

21. A beam exposure writing strategy system according to claim 18, wherein the microvector range is equal to about a horizontal pitch of the major field.

22. A beam exposure writing strategy system according to claim 17, wherein each microvector has a maximum useful length of about 2,000 nm.

23. A beam exposure writing strategy system according to claim 16, wherein flash locations overlap in the Y coordinate direction only.

24. A beam exposure writing strategy system according to claim 16, wherein the vector scanning includes generating microvectors at flash opportunity raster locations spaced along the major field scan lines.

25. A beam exposure writing strategy system according to claim 24, wherein each microvector reaches a given one of selectively adjustable pattern areas.

26. A beam exposure writing strategy system according to claim 25, wherein the selectively adjustable pattern areas include rectangles.

27. A beam exposure writing strategy system according to claim 25 wherein the selectively adjustable pattern areas include right isosceles triangles.

28. A beam exposure writing strategy system according to any one of claims 24-27, wherein the raster scan progresses along X and Y grid coordinates, further including causing beam flashes to occur at selected raster locations.

29. A beam exposure writing strategy system according to claim 28, wherein the flashes occur as the major scan advances along Y coordinate scan lines only.

30. A beam exposure writing strategy system according to claim 29, wherein a microvector extends between a raster location and a corner position of a flash area.

* * * * *